United States Patent
Lee et al.

(10) Patent No.: US 8,003,469 B2
(45) Date of Patent: Aug. 23, 2011

(54) METHOD OF MANUFACTURING NON-VOLATILE SEMICONDUCTOR DEVICES

(75) Inventors: Hak-Sun Lee, Seoul (KR); Kyoung-Sub Shin, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/611,362

(22) Filed: Nov. 3, 2009

(65) Prior Publication Data
US 2010/0112768 A1    May 6, 2010

(30) Foreign Application Priority Data

Nov. 5, 2008 (KR) .................... 10-2008-0109452

(51) Int. Cl.
*H01L 21/336* (2006.01)
(52) U.S. Cl. ........ 438/288; 438/264; 438/283; 438/689; 257/E21.18; 257/E21.21; 257/E21.679
(58) Field of Classification Search .................. 438/145, 438/288; 257/E21.177, E21.179, E21.18, 257/E21.678
See application file for complete search history.

(56) References Cited

U.S. PATENT DOCUMENTS

| 2006/0208338 A1* | 9/2006 | Lee et al. ............. 257/516 |
| 2008/0070368 A1* | 3/2008 | Kim et al. ............. 438/287 |
| 2010/0025752 A1* | 2/2010 | Dong ................... 257/324 |

FOREIGN PATENT DOCUMENTS

| JP | 08-078547 | 3/1996 |
| KR | 10-0770700 | 10/2007 |

\* cited by examiner

*Primary Examiner* — Cheung Lee
(74) *Attorney, Agent, or Firm* — F.Chau & Associates, LLC

(57) ABSTRACT

A non-volatile semiconductor device includes a memory cell in a first area of a substrate, a low voltage transistor in a second area of the substrate, and a high voltage transistor in a third area of the substrate. The memory cell includes a tunnel insulation layer formed on the substrate, a charge trapping layer pattern formed on the tunnel insulation layer in the first area of the substrate, a blocking layer pattern formed on the charge trapping layer pattern and a control gate formed on the blocking layer pattern. The control gate has a width substantially smaller than a width of the blocking layer pattern and the width of the control gate is substantially smaller than a width of the charge trapping layer pattern. In addition, an offset is formed between the control gate and the blocking layer pattern such that a spacer is not formed on a sidewall of the control gate.

12 Claims, 11 Drawing Sheets

METHOD OF MANUFACTURING NON-VOLATILE SEMICONDUCTOR DEVICES

CROSS-REFERENCE TO RELATED APPLICATION

This application claims priority under 35 U.S.C. §119 to Korean patent Application No. 2008-109452, filed on Nov. 5, 2008, the disclosure of which is hereby incorporated by reference herein in its entirety.

BACKGROUND

1. Technical Field

Example embodiments of the inventive concept relate to non-volatile semiconductor devices and to methods of manufacturing non-volatile semiconductor devices. More particularly, example embodiments of the inventive concept relate to flash memory devices having a required breakdown voltage while reducing a leakage current, and to a method of manufacturing the flash memory devices.

2. Description of the Related Art

Various data can typically be stored permanently or temporarily in semiconductor memory devices. In the semiconductor memory devices, the data may be stored in a memory cell thereof as logics of "0" or "1". The semiconductor devices are usually divided into volatile semiconductor memory devices and non-volatile semiconductor memory devices. The volatile semiconductor memory devices may lose the stored data when an applied power is off. However, the non-volatile semiconductor memory devices may keep the stored data even though an applied power is off.

A flash memory device, one of the non-volatile semiconductor memory devices, has been developed for various electronic apparatuses such as, for example, computers, digital cameras, portable multimedia players, cellular phones, MP3 players, games, memory sticks, etc. As for the conventional flash memory devices, data may be stored into the flash memory device or may be read from the flash memory device through the Fowler-Nordheim tunneling mechanism or through the hot electron injection mechanism.

The flash memory device may have a floating gate type or a charge trap type. The floating gate type flash memory device may not be properly employed in a current semiconductor device because the floating gate type flash memory device may not be highly integrated to a desired degree for the current extremely highly integrated semiconductor device. Hence, the charge trapping type flash memory device has been widely used because of the high integration degree thereof.

FIG. 1 is a cross sectional view showing the conventional charge trapping type flash memory device.

As shown in FIG. 1, the conventional charge trapping type flash memory device includes a tunnel oxide layer 15, a charge trapping layer pattern 20, a blocking layer pattern 25, a metal electrode 30, a mask 35 and a spacer 40.

The tunnel oxide layer 15 is formed on a substrate 10. The charge trapping layer pattern 20 and the blocking layer pattern 25 are sequentially formed on the tunnel oxide layer 15. The metal electrode 30 and the mask 35 are formed on the blocking layer pattern 25. The metal electrode 30 has a width smaller than the width of the blocking layer pattern 25. Thus, an offset is formed between the metal electrode 30 and the blocking layer pattern 25. The spacer 35 is located on sidewalls of the metal electrode 30.

The charge trapping type flash memory device may have an integration degree larger than the integration degree of the floating gate type flash memory device. The charge trapping layer pattern 20 is generally formed using a nitride for ensuring charge trap sites therein. The blocking layer pattern 25 includes a high-k material for preventing charges from moving toward the metal electrode 30.

However, etched damages such as defects may be generated at sidewalls of the blocking layer pattern 25 while etching a blocking layer to form the blocking layer pattern 25. Such defects of the blocking layer pattern 25 may serve as undesired charge trap sites to cause the movements of the charges thereto, so that the conventional charge trapping type flash memory device may have reduced breakdown voltage and increased leakage current. To resolve these difficulties, at least one spacer 40 is formed on the sidewall of the metal electrode 30 to maintain the offset between the metal electrode 30 and the blocking layer pattern 25.

FIG. 2A is a graph showing breakdown voltages relative to thicknesses of spacers in conventional charge trapping type flash memory devices. In FIG. 2A, a line A1 indicates a breakdown voltage variation of a first conventional charge trapping type flash memory device having double spacers of middle temperature oxide (MTO) and silicon nitride. Here, the double spacers have thicknesses of about 100 Å and about 130 Å, respectively. A line B1 denotes a breakdown voltage variation of a second conventional charge trapping type flash memory device including double spacers of MTO and silicon nitride, which have thicknesses of about 80 Å and about 105 Å. Further, a line C1 represents a breakdown voltage variation of a third conventional charge trapping type flash memory device including double spacers of MTO and silicon nitride, which have thicknesses of about 50 Å and about 70 Å.

FIG. 2B is a graph showing the breakdown voltages relative to leakage currents in the conventional charge trapping type flash memory devices. In FIG. 2B, a line A2 represents the breakdown voltage variation of the first conventional charge trapping type flash memory device, and a line B2 denotes the breakdown voltage variation of the second conventional charge trapping type flash memory device. Additionally, a line C2 means the breakdown voltage variation of the third conventional charge trapping type flash memory device, and a line D indicates a breakdown voltage variation of a fourth conventional charge trapping type flash memory device including double spacers of MTO and silicon nitride, which have thicknesses of about 100 Å and about 100 Å.

Referring to FIGS. 2A and 2B, the conventional charge trapping type flash memory device includes the double spacers of which thicknesses above about 50 Å and about 70 Å in an attempt to provide the desired breakdown voltage and leakage current when the conventional charge trapping type flash memory device has the double spacers for maintaining the offset.

FIG. 3 is an electron microscopic picture showing a conventional charge trapping type flash memory device having a spacer.

As shown in FIG. 3, gate structures having a metal gate (e.g., the light portion) and a spacer may be too closely arranged when the spacer is provided on a sidewall of the metal gate. That is, the adjacent gate structures may be connected to each other as the conventional charge trapping type flash memory device is highly integrated. Further, a charge trapping layer pattern and a blocking layer pattern may not be properly formed because a charge trapping layer and a blocking layer may not be etched when the adjacent gate structures having the spacers are closely arranged in a cell area of the conventional charge trapping type flash memory device.

SUMMARY

Example embodiments may provide a non-volatile semiconductor device ensuring a constant breakdown voltage and a reduced leakage current without a spacer.

Example embodiments may provide a method of manufacturing a non-volatile semiconductor device having a constant breakdown voltage and a reduced leakage current without a formation of a spacer.

In accordance with an example embodiment, a non-volatile semiconductor device is provided. The non-volatile semiconductor device includes a memory cell in a first area of a substrate, a low voltage transistor formed in a second area of the substrate, and a high voltage transistor formed in a third area of the substrate. The memory cell includes a tunnel insulation layer formed on the substrate, a charge trapping layer pattern formed on the tunnel insulation layer in the first area of the substrate, a blocking layer pattern formed on the charge trapping layer pattern and a control gate formed on the blocking layer pattern. The control gate has a width substantially smaller than a width of the blocking layer pattern and the width of the control gate is substantially smaller than a width of the charge trapping layer pattern. In addition, an offset is formed between the control gate and the blocking layer pattern such that a spacer is not formed on a sidewall of the control gate.

In example embodiments, a hard mask may be formed on the control gate. The hard mask may have a width substantially the same as or substantially similar to a width of the control gate.

In example embodiments, the control gate may include a metal, a metal compound and/or polysilicon. The blocking layer pattern may include a metal compound, a nitride and/or an oxide.

In example embodiments, the charge trapping layer pattern may have a width substantially the same as or substantially similar to a width of the blocking layer pattern.

In example embodiments, a width of the offset may be substantially the same as or substantially similar to a width difference between the control gate and the blocking layer pattern.

In accordance with another example embodiment, a method of manufacturing a non-volatile semiconductor device is provided. In the method of manufacturing the non-volatile semiconductor device, a tunnel insulation layer is formed on a substrate. A charge trapping layer is formed on the tunnel insulation layer in a first area of the substrate. A blocking layer is formed on the charge trapping layer. A preliminary control gate is formed on the blocking layer. A control gate is obtained by partially etching the preliminary control gate. A blocking layer pattern having a width substantially larger than a width of the control gate is formed by partially etching the blocking layer. A charge trapping layer pattern is formed by partially etching the charge trapping layer.

In example embodiments, a hard mask may be additionally formed on the preliminary control gate before forming the control gate. In the formation of the hard mask, a preliminary hard mask may be formed on the preliminary control gate. The hard mask may be formed by partially etching hard mask. The control gate may be formed using the hard mask as an etching mask.

In example embodiments, the hard mask and the control gate may be formed simultaneously.

In example embodiments, the preliminary hard mask and the preliminary control gate may be partially etched along a direction in substantially parallel to the substrate.

In example embodiments, the hard mask and the control gate may be formed by a dry etching process and/or a wet etching process.

In example embodiments, the blocking layer may be thermally treated at a temperature of about 950° C. to about 1,200° C.

In example embodiments, a low voltage transistor may be formed in a second area of the substrate, and a high voltage transistor may be formed in a third area on the substrate.

In accordance with still another example embodiment, a method of manufacturing a non-volatile semiconductor device is provided. In the method of manufacturing the non-volatile semiconductor device, a tunnel insulation layer, a charge trapping layer, a blocking layer, a control gate layer and a hard mask layer are sequentially formed on a substrate having a cell area, a low voltage transistor area and a high voltage transistor area. The hard mask layer is etched to form a first mask in the cell area and a second mask in the low and the high voltage transistor areas. The control gate layer is etched to form a preliminary control gate in the cell area and a sacrificial conductive pattern in the low and the high voltage transistor areas. The blocking layer is etched to form a blocking layer pattern in the cell area and a sacrificial blocking layer pattern in the low and the high voltage transistor areas. The first mask and the preliminary control gate are partially etched to form a hard mask and a control gate in the cell area. The charge trapping layer is etched to form a charge trapping layer pattern in the cell area and a sacrificial charge trapping layer pattern in the low and the high voltage transistor areas. The second mask, the sacrificial conductive pattern, the sacrificial blocking layer pattern and the sacrificial charge trapping layer pattern are removed in the low and the high voltage transistor areas. A low voltage MOS transistor is formed in the low voltage transistor area. A high voltage MOS transistor is formed in the high voltage transistor area.

In example embodiments, the hard mask and the control gate may be obtained by horizontally etching the first mask and the preliminary control gate. The control gate may have a width substantially smaller than a width of the blocking layer pattern such that a spacer is not formed on a sidewall of the control gate.

In example embodiments, a protection layer may be formed in the cell area to cover the hard mask, the control gate, the blocking layer pattern and the charge trapping layer pattern before removing the second mask, the sacrificial conductive pattern, the sacrificial blocking layer pattern and the sacrificial charge trapping layer pattern.

According to example embodiments, the control gate may have the width substantially smaller than a width of the blocking layer pattern without forming any spacer on the sidewall of the control gate. That is, the offset may be provided between the control gate and the blocking layer pattern to avoid the use of a spacer. Further, the charge trapping layer pattern having improved retention property may be readily formed because the process margin of the etching process for forming the charge trapping layer pattern. Thus, the flash memory device may have a high integration degree while improving electrical characteristics of the flash memory device such as desired breakdown voltage, reduced leakage current, enhanced retention property, etc.

BRIEF DESCRIPTION OF THE DRAWINGS

Example embodiments of the inventive concepts can be understood in more detail from the following description taken in conjunction with the accompanying drawings, in which.

DESCRIPTION OF THE EXAMPLE EMBODIMENTS

Figure 1:
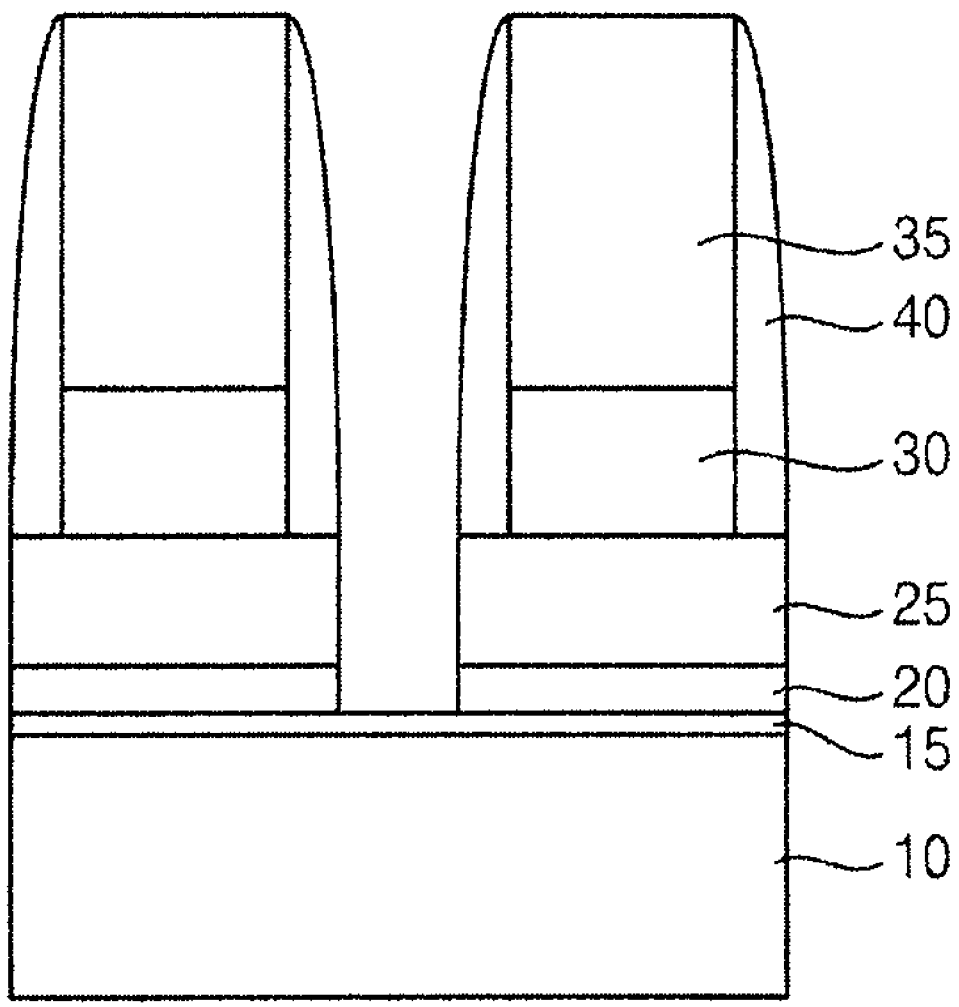
FIG. 1 is a cross sectional view showing the conventional flash memory device.
Figure 2A:
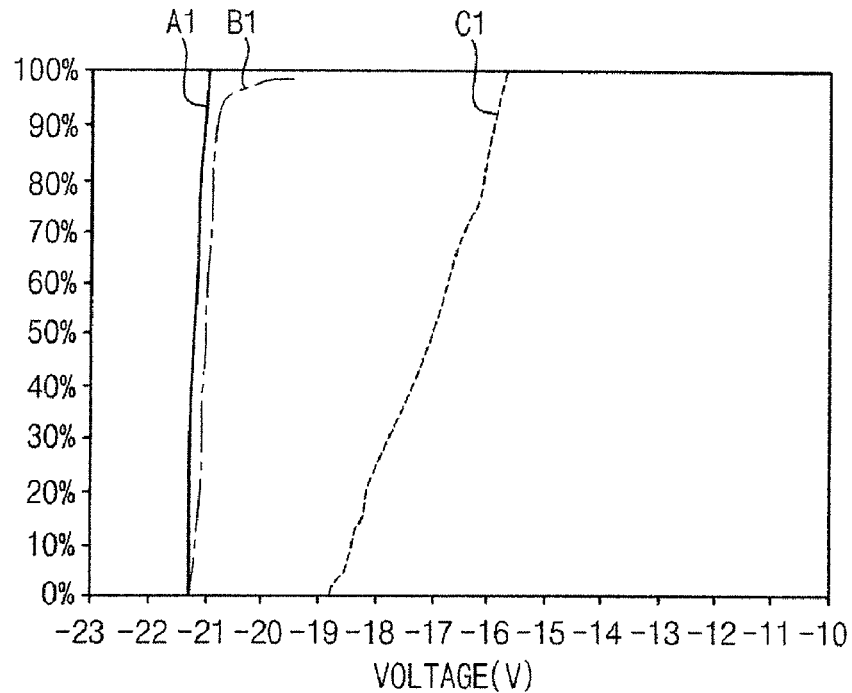
FIG. 2A is a graph showing breakdown voltages relative to thicknesses of spacers in conventional charge trapping type flash memory devices.
Figure 2B:
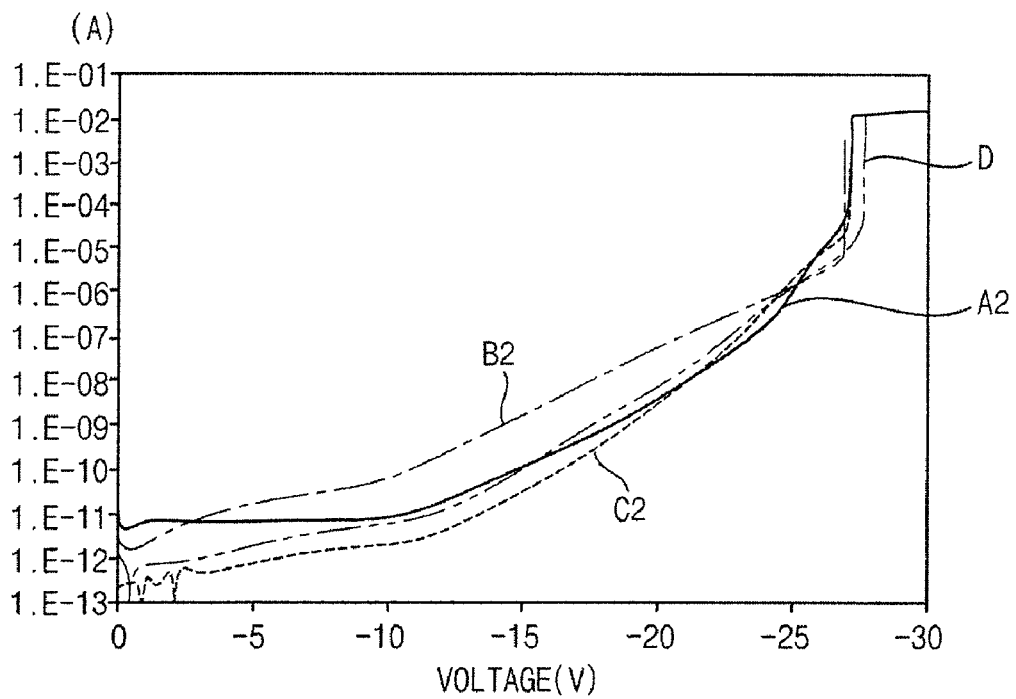
FIG. 2B is a graph showing the breakdown voltages relative to leakage currents in the conventional charge trapping type flash memory devices.
Figure 3:
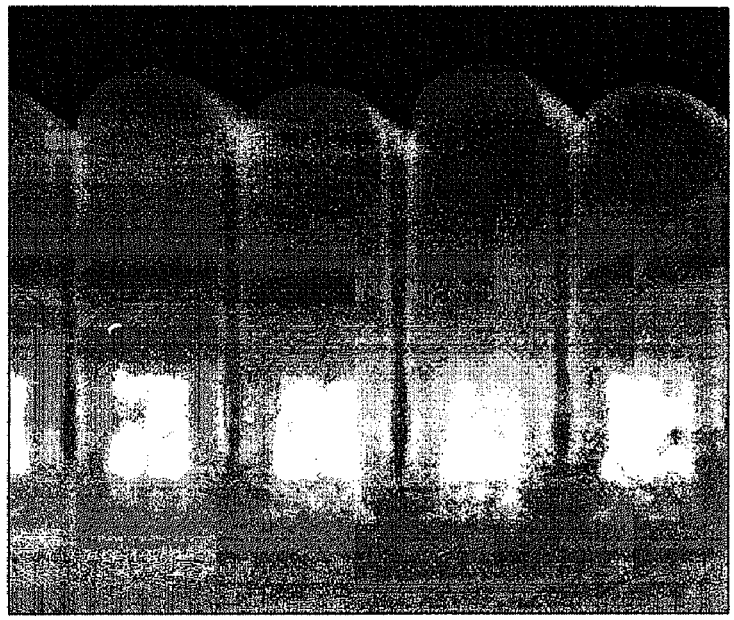
FIG. 3 is an electron microscopic picture showing a conventional charge trapping type flash memory device having a spacer.

Example embodiments of the inventive concept are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terns are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 4 to 7 are cross sectional views illustrating methods of manufacturing non-volatile semiconductor devices in accordance with an example embodiment. Although FIGS. 4 to 7 illustrate methods of manufacturing charge trapping type flash memory devices, the inventive concepts may be properly employed in manufacturing other semiconductor devices, such as for example, floating gate type flash memory devices, dynamic random access memory (DRAM) devices, static random access memory (SRAM) devices, etc.

Figure 4:
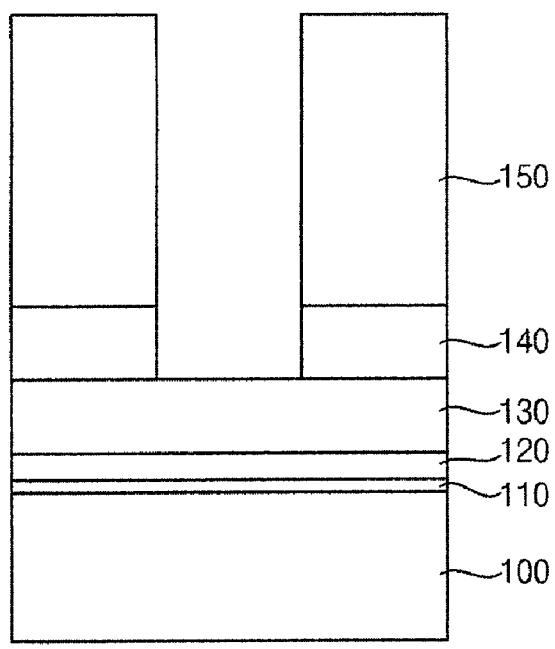
FIGS. 4 to 7 are cross sectional views illustrating a method of manufacturing a non-volatile semiconductor device in accordance with an example embodiment.

Referring to FIG. 4, a tunnel insulation layer 110 is formed on a substrate 100. The substrate 100 may include, for example, a semiconductor substrate, a silicon-on-insulator (SOI) substrate, a germanium-on-insulator (GOI) substrate, etc. Examples of the semiconductor substrate may include but are not limited to a silicon (Si) substrate, a germanium (Ge) substrate, a silicon-germanium (Si—Ge) substrate, etc.

In example embodiments, the tunnel insulation layer 110 may be formed on the substrate 100 by, for example, a thermal oxidation process. When the substrate 100 includes silicon, the tunnel insulation layer 110 may include, for example, silicon oxide obtained by thermally oxidizing an upper portion of the substrate 100. The tunnel insulation layer 110 may have a relatively thin thickness of, for example, about 50 Å to about 100 Å measured from an upper face of the substrate 100.

In some example embodiments, the tunnel insulation layer 110 may be obtained by, for example, a radical oxidation process. The tunnel insulation layer 110 formed by the radical oxidation process may ensure good durability while repeatedly performing a writing operation and a reading operation of the flash memory device. Further, the tunnel insulation layer 110 may have a dense structure when the tunnel insulation layer 110 is formed by the radical oxidation process.

A charge trapping layer 120 is formed on the tunnel insulation layer 110. The charge trapping layer 120 may have numerous charge trap sites for storing charges such as electrons or holes. The charge trapping layer 120 may be formed using a nitride, for example, silicon nitride ($SiN_x$). The charge trapping layer 120 may be formed by, for example, a chemical vapor deposition (CVD) process, an atomic layer deposition (ALD) process, a plasma enhanced chemical vapor deposition (PECVD) process, a low pressure chemical vapor deposition (LPCVD) process, etc. The charge trapping layer 120 may have a thickness of, for example, about 100 Å to about 200 Å based on an upper face of the tunnel insulation layer 110.

In some example embodiments, the charge trapping layer 120 may have, for example, a multi layer structure having nanodots that includes at least one oxide film, at least one nitride film and at least one metal oxide film having a high dielectric constant. Examples of the metal oxide may include but are not limited to aluminum oxide ($AlO_x$), hafnium oxide ($HfO_x$), zirconium oxide ($ZrO_x$), titanium oxide ($TiO_x$), tantalum oxide ($TaO_x$), etc. These may be used alone or in a mixture thereof.

A blocking layer 130 is formed on the charge trapping layer 120. The blocking layer 130 may prevent the charges from moving toward a preliminary control gate 140 through the charge trapping layer 120.

In example embodiments, the blocking layer 130 may be formed using, for example, a high-k material having a dielectric constant substantially larger than that of the tunnel insulation layer 110. For example, the blocking layer 130 may include a metal compound such as hafnium oxide ($HfO_x$), aluminum oxide ($AlO_x$), hafnium-aluminum oxide ($HfAl_xO_y$), zirconium oxide ($ZrO_x$), etc. These may be used alone or in a mixture thereof. Additionally, the blocking layer 130 may be formed by, for example, a CVD process, an ALD process, a sputtering process, a pulsed laser deposition (PLD) process, a high density plasma chemical vapor deposition (HDP-CVD) process, an evaporation process, etc.

In some example embodiments, the blocking layer 130 may have a multi layer structure that includes, for example, at least one metal compound film, at least one oxide film and/or at least one nitride film.

A control gate layer is formed on the blocking layer 130. The control gate layer may be formed using, for example, a metal, a metal compound and/or polysilicon. For example, the control gate layer may include aluminum, ruthenium (Ru), tungsten (W), titanium (Ti), tantalum (Ta), tungsten nitride ($WN_x$), titanium nitride ($TiN_x$), tantalum nitride ($TaN_x$), aluminum nitride ($AlN_x$), polysilicon doped with impurities, etc. These may be used alone or in a mixture thereof. Further, the control gate layer may be formed by, for example, a CVD process, an ALD process, a sputtering process, a PLD process, a PECVD process, an evaporation process, etc. The control gate layer may have a relatively thick thickness of, for example, about 1,000 Å to about 2,000 Å based on an upper face of the blocking layer 130.

A preliminary hard mask 150 is foamed on the control gate layer. The preliminary hard mask 150 may be formed using, for example, an oxide, a nitride, an organic material, etc. These may be used alone or in a mixture thereof. In example embodiments, the preliminary hard mask 150 may have a single layer structure or a multi layer structure for forming a minute pattern. For example, the preliminary hard mask 150 may include an oxide film, an organic material film and a nitride film. Alternatively, the preliminary hard mask 150 may include, for example, a lower nitride film, an organic material film and an upper nitride film. Here, the nitride film and the upper nitride film may serve anti-reflective layers, respectively.

In the formation of the preliminary hard mask 150, a hard mask layer may be formed on the control gate layer, and then a photoresist pattern may be provided on the hard mask layer. After the hard mask layer is patterned by a photolithography process using the photoresist pattern as an etching mask, the preliminary hard mask 150 may be obtained on the control gate layer. The photoresist pattern may be removed from the preliminary hard mask 150 by, for example, an ashing process and/or a stripping process.

Using the preliminary hard mask 150 as an etching mask, the control gate layer is partially etched to form the preliminary control gate 140 on the blocking layer 130. When the preliminary control gate 140 is disposed on the blocking layer 130, the blocking layer 130 is partially exposed.

Figure 5:
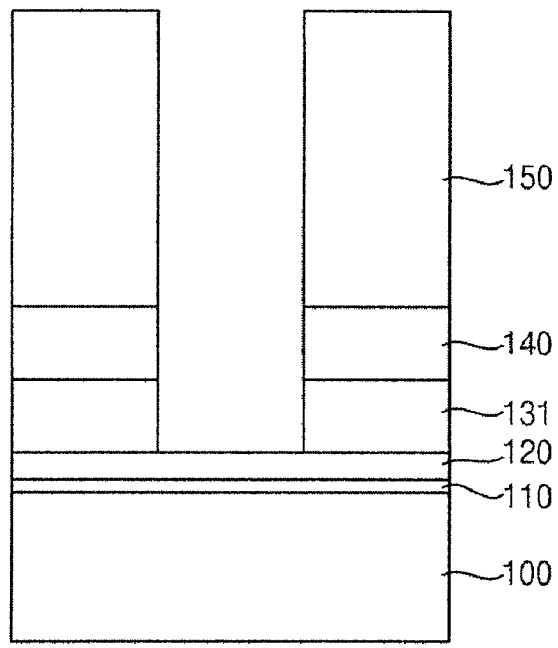

Referring to FIG. 5, an exposed portion of the blocking layer 130 through the preliminary control gate 140 is etched still using the preliminary hard mask 150 as an etching mask. Thus, a blocking layer pattern 131 is formed on the charge trapping layer 120. While partially etching the blocking layer 130, the charge trapping layer 120 may serve as an etching end point when the charge trapping layer 120 includes a material different from that of the blocking layer 130.

In the formation of the blocking layer pattern 131, process conditions of an etching process may be properly adjusted to prevent defects from generating at a sidewall of the blocking layer pattern 131. When the defects generate at the sidewall of the blocking layer pattern 131, the defects may serve as trapping sites for the charges, so that the charges may be undesirably trapped into the defects at the blocking layer pattern 131. Hence, as a result, the flash memory device may have a desired breakdown voltage and a reduced leakage current.

Figure 6:
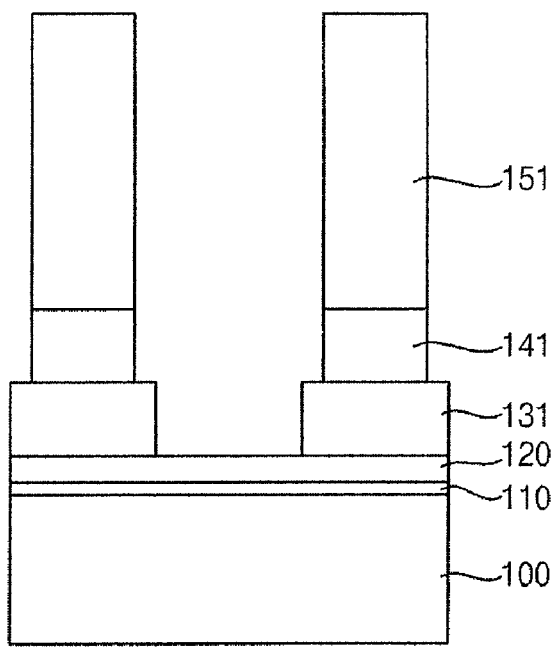

Referring to FIG. 6, the preliminary hard mask 150 and the preliminary control gate 140 may be partially etched to form a hard mask 151 and a control gate 141 on the blocking layer pattern 131.

In example embodiments, the preliminary hard mask 150 and the preliminary control gate 140 may be partially etched along a direction substantially in parallel relative to the substrate 100. Hence, the hard mask 151 and the control gate 141 may have widths substantially smaller the widths of the preliminary hard mask 150 and the preliminary control gate 140, respectively. Further, the width of the control gate 141 may be substantially smaller than the width of the blocking layer pattern 131. Hence, an offset may be provided between the control gate 141 and the blocking layer pattern 131. When the control gate 141 has the width substantially smaller than the width of the blocking layer pattern 131, adjacent control gates 141 may be separated from each other without forming any spacer on a sidewall of the control gate 141 even though the flash memory device has a minute design rule. Additionally, the charge trapping layer 120 may be more readily etched in a successive etching process because an etchant for the charge trapping layer 120 may be readily contacted with the charge trapping layer 120 through the control gate 141 having a reduced width.

According to example embodiments, a spacer may not be formed on sidewalls of the control gate 141 and the blocking layer pattern 131. Therefore, manufacturing processes for the flash memory device may be more simplified and the integration degree of the flash memory device may be improved. Further, a charge trapping layer pattern 121 (see FIG. 7) may have an increased width without forming the spacer, so that the charge trapping layer pattern 121 may have an enhanced retention property to thereby improve electrical characteristics of the flash memory device.

Figure 7:
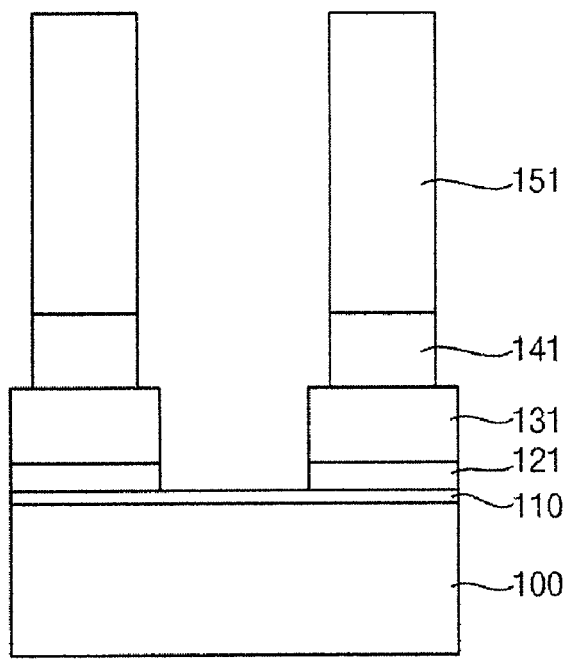

Referring to FIG. 7, the charge trapping layer 120 is partially etched using the hard mask 150 and the control gate 141 as etching masks to form the charge trapping layer pattern 121 on the tunnel insulation layer 110. The charge trapping layer pattern 121 may have a width substantially larger than the width of the control gate 141 or the hard mask 151. Further, the width of the charge trapping layer pattern 121 may be substantially the same as or substantially similar to the width of the blocking layer pattern 131. As described above, a spacer may not be provided on any of the sidewalls of the control gate 141, the blocking layer pattern 131 and the charge trapping layer pattern 121. That is, the offset may be provided among the control gate 141, the blocking layer pattern 131 and the charge trapping layer pattern 121 without forming a spacer. Therefore, the charge trapping layer pattern 121 may be obtained with an increased process margin and also the integration degree of the flash memory device may be increased while simplifying the processes for manufacturing the flash memory device. Furthermore, the blocking layer pattern 131 may not have defects at the sidewall thereof so that the flash memory device may ensure enhanced electrical characteristics such as, for example, constant breakdown voltage, reduced leakage current, improved retention property, etc.

FIGS. 8 to 16 are cross sectional views illustrating a method of manufacturing a non-volatile semiconductor device in accordance with other example embodiments. FIGS. 8 to 16 illustrate a method of manufacturing a charge trapping type flash memory device. However, the inventive concepts may be employed in manufacturing other semiconductor devices such as, for example, a floating gate type flash memory device, a DRAM device, an SRAM device, etc.

Figure 8:
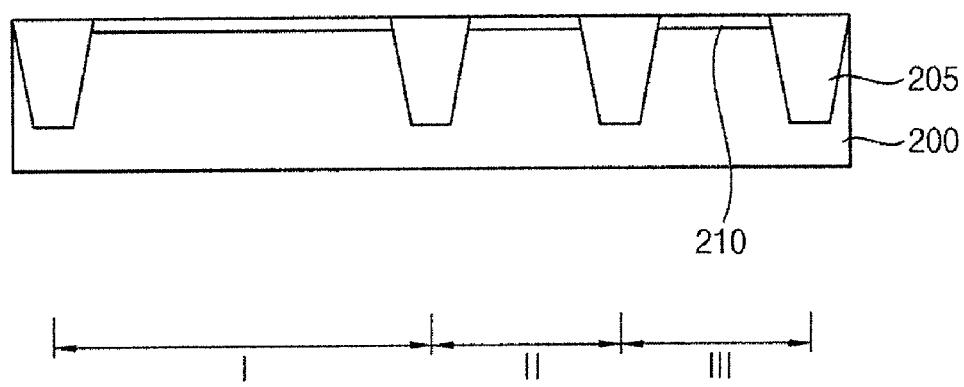
FIGS. 8 to 16 are cross sectional views illustrating a method of manufacturing a non-volatile semiconductor device in accordance with an example embodiment.

Referring to FIG. 8, isolation layers 205 are formed on a substrate 200 to define a cell area I, a low voltage transistor area II and a high voltage transistor area III. Memory cells of the flash memory device may be provided in the cell area I, and a low voltage metal oxide semiconductor (MOS) transistor may be formed in the low voltage transistor area II. Additionally, a high voltage MOS transistor may be positioned in the high voltage transistor area III.

In example embodiments, impurities may be doped into the low and the high voltage transistor areas II and III for the low and the high voltage MOS transistors. The conductive types of the impurities may be determined in accordance with the conductive types of the MOS transistors. Further, wells may be formed in the low and the high voltage transistor areas II and III of the substrate 200 considering the conductive types of the MOS transistors such as, for example, an N type MOS (NMOS) transistor, a P type MOS (PMOS) transistor or a complementary MOS (CMOS) transistor. That is, the conductivity types of the impurities and the wells may vary in accordance with the conductivity types of the MOS transistors formed on the substrate 200.

The substrate 200 may include, for example, a semiconductor substrate, an SOI substrate, a GOI substrate, etc. The isolation layers 205 may be formed on the substrate 200 by an isolation process, for example, a shallow trench isolation (STI) process.

In the formations of the isolation layers 205, trenches may be formed on the substrate 200 by partially etching the substrate 200. Each of the trenches may have a sidewall inclined relative to the substrate 200 with a predetermined angle. In other words, each of the trenches may have an upper width substantially larger than a lower width. When the trenches have inclined sidewalls, the isolation layers 205 may readily fill up the trenches. Further, stress may be generated in the substrate 200 while partially etching the substrate 200 for forming the trenches. The stresses may also be reduced when the trenches have the inclined sidewalls.

In example embodiments, the isolation layers 205 may be formed using, for example, spin on glass (SOG), undoped silicate glass (USG), Tonen silazene (TOSZ), tetraethylortho silicate (TEOS), flowable oxide (FOX), HDP-CVD oxide, etc. Each of the isolation layers 205 may have a multi layer structure. For example, each isolation layer 205 may include a USG film and an HDP-CVD oxide film. When the isolation layers 205 have the multi layer structures, voids or seams generated in the isolation layers 205 may be effectively prevented. Additionally, each of the isolation layers 205 may have a relatively large thickness of, for example, about 2,000 Å to about 4,000 Å.

In some example embodiments, field impurities may be doped into portions of the substrates 200 adjacent to the isolation layers 205. The field impurities may effectively isolate elements formed on the substrate 200. The field impurities may be implanted into the portions of the substrate 200 before forming the isolation layers 205.

In example embodiments, the isolation layers 205 may have different depths and widths in accordance with the positions of the isolation layers 205. For example, the isolation layers 205 in the high voltage transistor area III may have widths and depths substantially larger than those of the isolation layers 205 located in the low voltage transistor area II or the cell area I.

Referring now to FIG. 8, a tunnel insulation layer 210 is formed on the substrate 200 having the isolation layers 205. The tunnel insulation layer 210 may be formed on the substrate 200 by, for example, a thermal oxidation process or a radical oxidation process. As the tunnel insulation layer 210 may have good durability while repeatedly performing a writing operation and a reading operation of the flash memory device, the tunnel insulation layer 210 may have a dense structure when the tunnel insulation layer 210 is obtained by the radical oxidation process.

In the writing operation of the flash memory device, charges may be injected into a charge trapping layer pattern 221 (see FIG. 12) through the tunnel insulation layer 210. When the tunnel insulation layer 210 has a very thin thickness, the tunnel insulation layer 210 may be readily deteriorated because of the tunneling of the charges, thereby reducing the reliability of the flash memory device. However, the charges may not be properly injected into the charge trapping layer pattern 221 through the tunnel insulation layer 210 when the tunnel insulation layer 210 has a thin thickness. Therefore, the tunnel insulation layer 210 may have a relatively small thickness in a range of, for example, about 50 Å to about 100 Å.

In some example embodiments, the tunnel insulation layer 210 may have a multi layer structure. For example, the tunnel insulation layer 210 may include at least one nitride film and at least one oxide film. Here, the tunnel insulation layer 210 may be formed using, for example, silicon nitride and/or silicon oxide.

Figure 9:
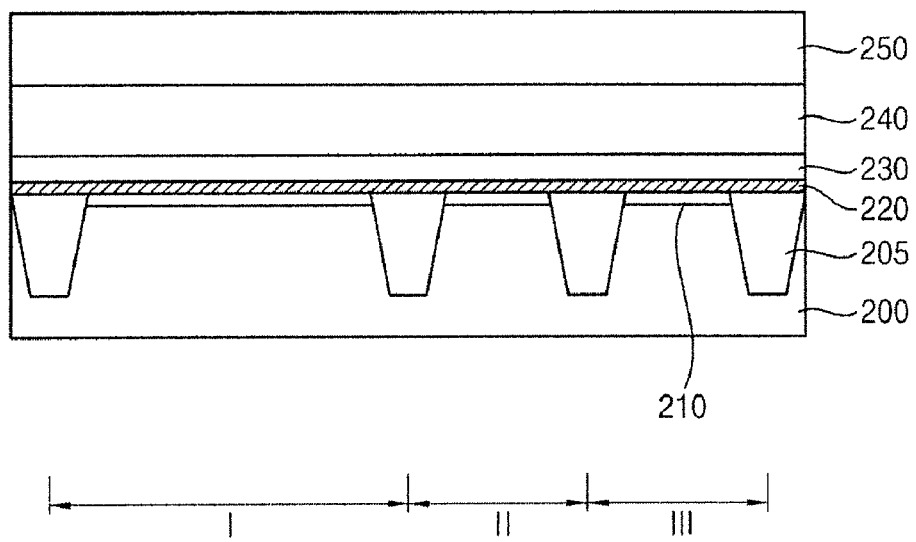

Referring to FIG. 9, a charge trapping layer 220 is formed on the tunnel insulation layer 210 and the isolation layers 205. The charge trapping layer 220 may include charge trap sites for storing charges such as electrons or holes. The charge trapping layer 220 may be formed using, for example, a nitride, for example, silicon nitride (SiNx) by a CVD process, an ALD process, a PECVD process, an LPCVD process, etc. For example, the charge trapping layer 220 may have a thickness of about 100 Å to about 200 Å.

In some example embodiments, the charge trapping layer 220 may have a multi layer structure including nanodots using, for example, an oxide, a nitride and/or a metal oxide. Examples of the metal oxide may include but are not limited to aluminum oxide, hafnium oxide, zirconium oxide, titanium oxide, tantalum oxide, etc. These may be used alone or in a mixture thereof.

When the charge trapping layer 220 has the relatively high density of the charge trap sites, the flash memory device may ensure an improved retention property. However, the charge trapping layer 220 may be readily deteriorated when the charge trapping layer 220 has the very high density of the charge trap sites. Thus, the charge trapping layer 220 may have the proper density of the charge trap sites based upon the retention property of the flash memory device and the deterioration of the charge trapping layer 220.

A blocking layer 230 is formed on the charge trapping layer 220. The blocking layer 230 may prevent the movement of the charges toward a preliminary control gate 241 (see FIG. 10) through the charge trapping layer 220.

The blocking layer 230 may include a high-k material having a dielectric constant substantially larger than that of the tunnel insulation layer 210. For example, the blocking layer 230 may include a metal compound such as hafnium oxide, aluminum oxide, hafnium-aluminum oxide, zirconium oxide, etc. Further, the blocking layer 230 may include the oxide of an element in Lanthan Group such as gadolinium oxide (GdOx). These may be used alone or in a mixture thereof. Alternatively, the blocking layer 230 may be formed using an oxide such as, for example, silicon oxide (SiOx). The blocking layer 230 may be formed by, for example, a CVD process, an ALD process, a sputtering process, a PLD process, an HDP-CVD process, an evaporation process, etc. The blocking layer 130 may have, for example, a multi layer structure that includes at least one metal compound film, at least one oxide film and/or at least one nitride film.

In some example embodiments, a thermal treatment may be performed about the blocking layer 230 to improve a structure of the blocking layer 230. The thermal treatment process may be carried out at a temperature of, for example, about 950° C. to about 1,200° C.

A control gate layer 240 is formed on the blocking layer 130. The control gate layer 240 may include, for example, a metal, a metal compound and/or polysilicon. For example, the control gate layer 240 may be formed using aluminum, ruthenium, tungsten, titanium, tantalum, tungsten nitride, titanium nitride, tantalum nitride, aluminum nitride, polysilicon doped with impurities, etc. These may be used alone or in a mixture thereof. Further, the control gate layer 240 may be formed by, for example, a CVD process, an ALD process, a sputtering process, a PLD process, a PECVD process, an evaporation process, etc. The control gate layer 240 may have a relatively thick thickness of, for example, about 1,000 Å to about 2,000 Å.

A hard mask layer 250 is formed on the control gate layer 240. The hard mask layer 250 may be formed using, for example, an oxide, a nitride, an organic material, etc. These may be used alone or in a mixture thereof. The hard mask layer 250 may have a single layer structure or a multi layer structure for forming a minute pattern. For example, the hard mask layer 250 may include an oxide film, an organic material film and/or a nitride film. Alternatively, the hard mask layer 250 may include, for example, a lower nitride film, an organic material film and an upper nitride film. The nitride film and the upper nitride film may serve anti-reflective layers, respectively.

Figure 10:
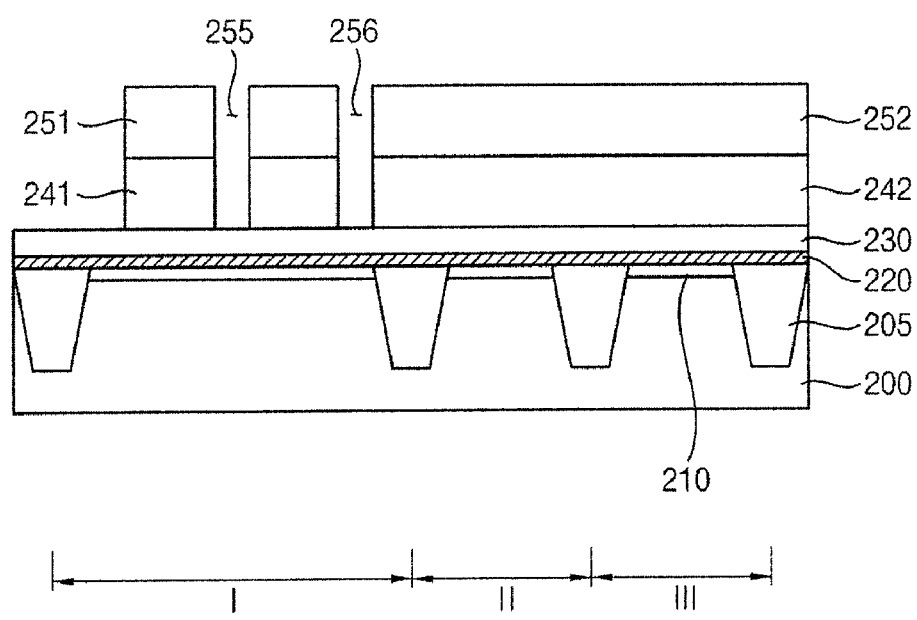

Referring to FIG. 10, the hard mask layer 250 is patterned to form a first hard mask 251 and a second hard mask 252. The first and the second hard masks 251 and 252 may be formed by a photolithography process. The first hard mask 251 is located in the cell area I of the substrate 200, and the second hard mask 252 is positioned in the low and the high voltage transistor areas II and III.

In example embodiments, a plurality of first hard masks 251 may be provided in the cell area I for a plurality of memory cells in the flash memory device. However, one second hard mask 252 may be formed in the low and the high voltage transistor areas II and III where the low and the high voltage MOS transistors are provided.

Using the first and the second hard masks 251 and 252 as etching masks, the control gate layer 240 is etched to form the preliminary control gate 241 and a sacrificial conductive pattern 242 over the substrate 200. The preliminary control gate 241 is positioned in the cell area I whereas the sacrificial conductive pattern 242 is located in the low and the high voltage transistor areas II and III. Here, a plurality of preliminary control gates 241 may be formed in the cell area I for the memory cells in the flash memory device and one sacrificial conductive pattern 242 may be provided in the low and the high voltage transistor areas II and III on which the low and the high voltage MOS transistors are formed.

When the preliminary control gate 241 and the sacrificial conductive pattern 242 are formed over the substrate 200, a first opening 255 is formed between adjacent preliminary control gates 241 in the cell area I. Further, a second opening 256 provided between an outermost preliminary control gate 241 and the sacrificial conductive pattern 242. That is, the second opening 256 is positioned between the cell area I and the low voltage transistor area II.

Figure 11:
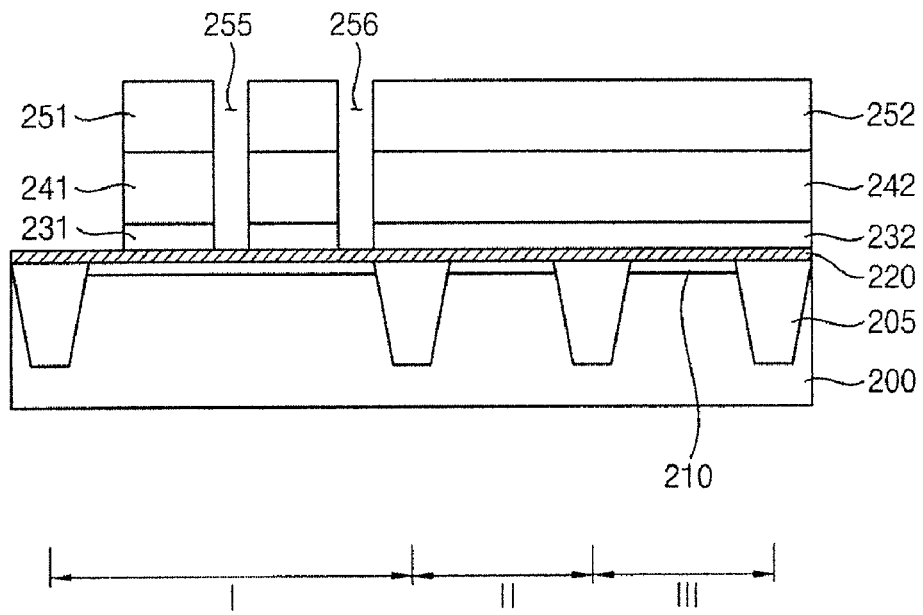

Referring to FIG. 11, the blocking layer 230 is partially etched using the first and the second hard masks 251 and 252 as etching masks, such that a blocking layer pattern 231 and a sacrificial blocking layer pattern 232 are formed on the charge trapping layer 220. The blocking layer pattern 231 is formed in the cell area I, and the sacrificial blocking layer pattern 232 is located in the low and the high voltage transistor areas II and III.

While forming the blocking layer pattern 231 and the sacrificial blocking layer pattern 232, the charge trapping layer 220 may serve an etching end point of an etching process for etching the blocking layer 230. In the formation of the blocking layer pattern 231 and the sacrificial blocking layer pattern 232, process conditions of the etching process may be properly controlled to prevent defects from generating at a sidewall of the blocking layer pattern 231. Therefore, the flash memory device may have a desired breakdown voltage and a reduced leakage current by preventing the charges from moving into the blocking layer pattern 231.

After forming the blocking layer pattern 231 and the sacrificial blocking layer pattern 232, the first and the second openings 255 and 256 are extended to thereby expose portions of the charge trapping layer 220. In some example embodiments, a thermal treatment process may be performed on the blocking layer pattern 231 to cure an etched damage to the blocking layer pattern 231.

Figure 12:
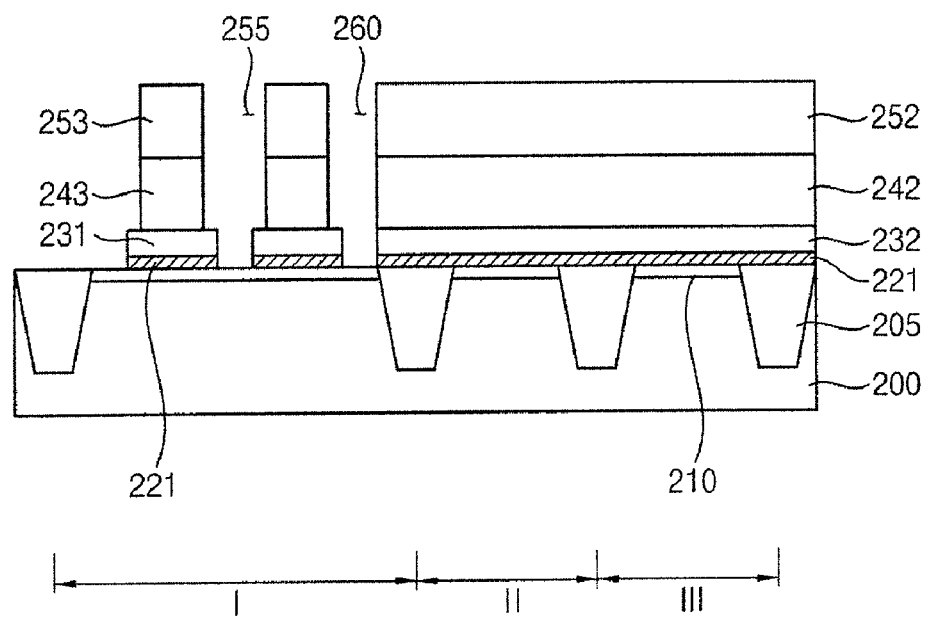

Referring to FIG. 12, the first mask 251 and the preliminary control gate 241 are partially etched to form a hard mask 253 and a control gate 243 on the blocking layer pattern 231 in the cell area I. However, the second mask 252 and the sacrificial conductive pattern 242 are not etched while forming the hard mask 253 and the control gate 243.

In example embodiments, the first hard mask 251 and the preliminary control gate 241 may be partially etched in a direction substantially in parallel relative to the substrate 200. Thus, each of the hard mask 253 and the control gate 243 may have a width substantially smaller that those of the first hard mask 251 and the preliminary control gate 241. Additionally, the width of the control gate 243 may be substantially smaller than those of the blocking layer pattern 231 and the charge trapping layer pattern 221. When the control gate 243 has the width substantially smaller than those of the blocking layer pattern 131 and the charge trapping layer pattern 221, adjacent control gates 243 may be separated from each other although the flash memory device has a minute design rule. Furthermore, the charge trapping layer 220 may be more readily etched in a successive etching process because an etchant for the charge trapping layer 220 may be readily contacted with the charge trapping layer 220 through the control gate 243 having a reduced width.

In some example embodiments, a spacer may not be formed on sidewalls of the control gate 243 and the blocking layer pattern 231. Thus, manufacturing processes for the flash memory device may be more simplified and the integration degree of the flash memory device may be improved. Further, a charge trapping layer pattern 221 may have an increased width without forming the spacer, so that the charge trapping layer pattern 221 may have an enhanced retention property to thereby improve electrical characteristics of the flash memory device.

Referring now to FIG. 12, the charge trapping layer 220 is partially etched using the hard mask 253, the control gate 243 and the blocking layer pattern 231 as etching masks, so that a charge trapping layer pattern 221 and a sacrificial charge trapping layer pattern 222 are formed on the tunnel insulation layer 210. The charge trapping pattern 221 is positioned in the cell area I, and the sacrificial charge trapping layer pattern 222 is formed in the low and the high voltage transistor areas II and III. Thus, a memory cell of the flash memory device is formed in the cell area I. The memory cell includes the tunnel insulation layer 210, the charge trapping layer pattern 221, the blocking layer pattern 231, the control gate 243 and the hard mask 253. However, no spacers are provided on a sidewall of the control gate 243 as described above.

In example embodiments, the charge trapping layer pattern 221 may have a width substantially larger than the width of the control gate 243 or the hard mask 253. The width of the charge trapping layer pattern 221 may be substantially the same as or substantially similar to the width of the blocking layer pattern 231. The spacer may not be provided on the sidewalls of the control gate 243, the blocking layer pattern 231 and the charge trapping layer pattern 221. An offset may be provided among the control gate 243, the blocking layer pattern 231 and the charge trapping layer pattern 221 without forming the spacer. Therefore, the charge trapping layer pattern 221 may be obtained with an increased process margin and also the integration degree of the flash memory device may be increased while simplifying the processes for manufacturing the flash memory device. Further, the blocking layer pattern 231 may not have defects at the sidewall thereof so that the flash memory may ensure enhanced electrical characteristics such as, for example, a constant breakdown voltage, a reduced leakage current, an improved retention property, etc.

Figure 13:
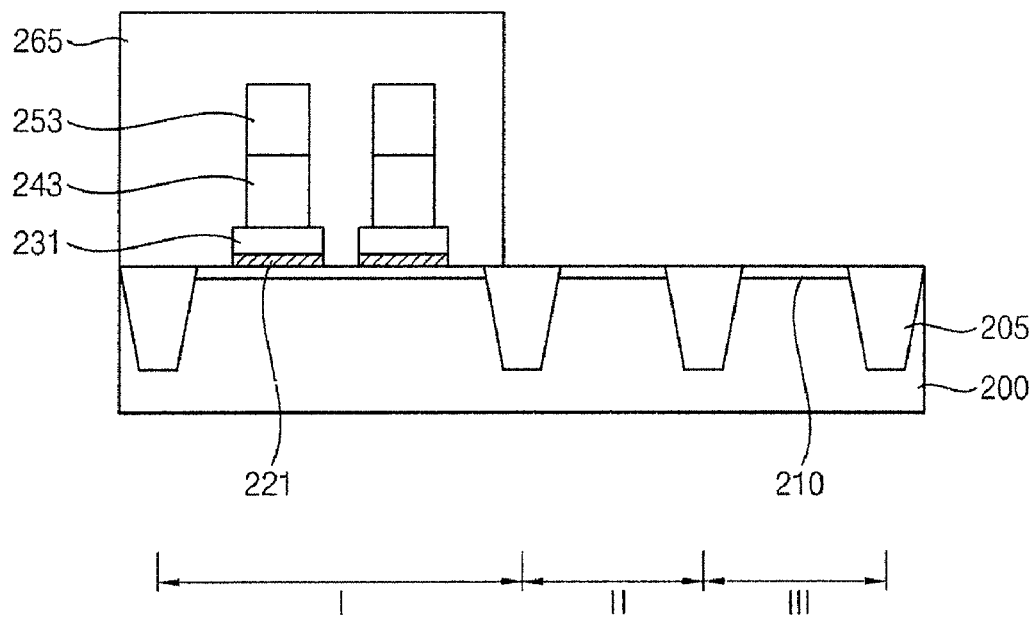

Referring to FIG. 13, a protection layer 265 is formed on the substrate 200 to cover the resultant structures in the cell area I. That is, the protection layer 265 covers the hard mask 253, the control gate 243, the blocking layer pattern 231 and the charge trapping layer pattern 221 in the cell area I. However, the protection layer 265 is not formed in the low and the high voltage transistor areas II and III. So that the resultant structure in the low and the high voltage transistor areas II and III are exposed.

In example embodiments, the protection layer 265 may be formed using, for example, an oxide or a photoresist. Examples of the oxide in the protection layer 265 may include but are not limited to USG, SOG, FOX, TOSZ, HDP-CVD oxide, etc. Further, the protection layer 265 may be formed by, for example, a CVD process, a PECVD process, an HDP-CVD process, a spin coating process, etc.

The second hard mask 252, the sacrificial conductive pattern 242, the sacrificial blocking layer pattern 232 and the sacrificial charge trapping layer pattern 222 are removed from the low and the high voltage transistor areas II and III. The second hard mask 252, the sacrificial conductive pattern 242, the sacrificial blocking layer pattern 232 and the sacrificial charge trapping layer pattern 222 may be removed by, for example, a wet etching process and/or a dry etching process.

Figure 14:
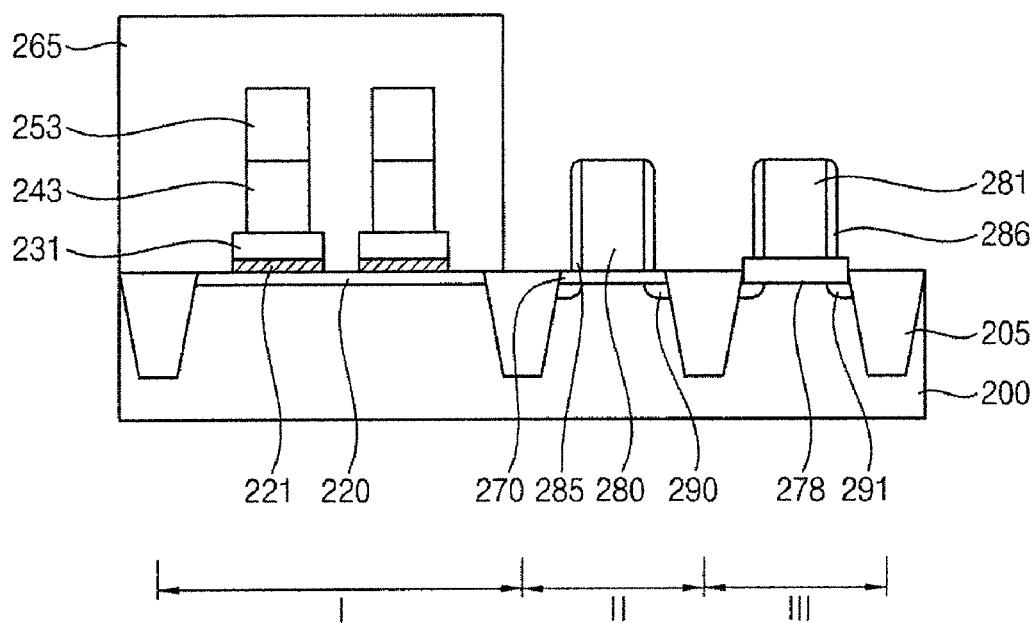

Referring to FIG. 14, after removing the tunnel insulation layer 210 in the low and the high voltage transistor areas II and III, a first gate insulation layer 270 and a second gate insulation layer 278 are formed in the low voltage transistor area II and the high voltage transistor area III, respectively. Each of the first and the second gate insulation layers 270 and 278 may be formed using, for example, an oxide or a metal oxide.

In example embodiments, the first gate insulation layer 270 may have a thickness substantially smaller than the thickness of the second gate insulation layer 278 when each of the first and the second gate insulation layers 270 and 278 includes, for example, silicon oxide. However, the second gate insulation layer 278 may have a thickness substantially similar to or substantially the same as the thickness of the first gate insulation layer 270 when the second gate insulation layer 278 includes a material different from that of the first gate insulation layer 270. For example, the second gate insulation layer 278 includes a metal oxide, and the first gate insulation layer 270 includes silicon oxide.

A first gate electrode 280 and a second gate electrode 281 are respectively formed on the first gate insulation layer 270 and the second gate insulation layer 278. Each of the first and the second gate electrodes 280 and 281 may be formed using, for example, polysilicon, a metal and/or a metal compound. For example, the first and the second gate electrodes 280 and 281 may include polysilicon doped with impurities, tungsten, aluminum, ruthenium, tantalum, tantalum nitride, tungsten nitride, hafnium nitride, tungsten silicide, titanium silicide, cobalt silicide, etc. These may be used alone or in a mixture thereof. Further, each of the first and the second gate electrodes 280 and 281 may have a thickness of, for example, about 1,000 Å to about 2,000 Å.

In some example embodiments, the first gate electrode 280 may include a material different from that of the second gate electrode 281 in accordance with electrical characteristics of the flash memory device.

A first gate mask and a second gate mask may be provided on the first gate electrode 280 and the second gate electrode 281, respectively. Here, the first and the second gate masks may be formed using, for example, a nitride such as silicon nitride or an oxynitride like silicon oxynitride.

A first spacer 285 is formed on a sidewall of the first gate electrode 280, and a second spacer 286 is formed on a side wall of the second gate electrode 281. The first and the second spacers 285 and 286 may be formed using, for example, a nitride or an oxynitride. For example, each of the first and the second spacers 285 and 286 may include silicon nitride or silicon oxynitride.

First impurity regions 290 is formed at portions of the low voltage transistor area II adjacent to the first gate electrode 280 by implanting first impurities into the portions of the low voltage transistor area II. Further, second impurity regions 291 are formed at portions of the high voltage transistor area III by doping second impurities into the portions of the high voltage transistor area III. The first impurities may have a conductive type different from that of the second impurities in accordance with the conductivity types of the low and the high voltage MOS transistors.

Figure 15:
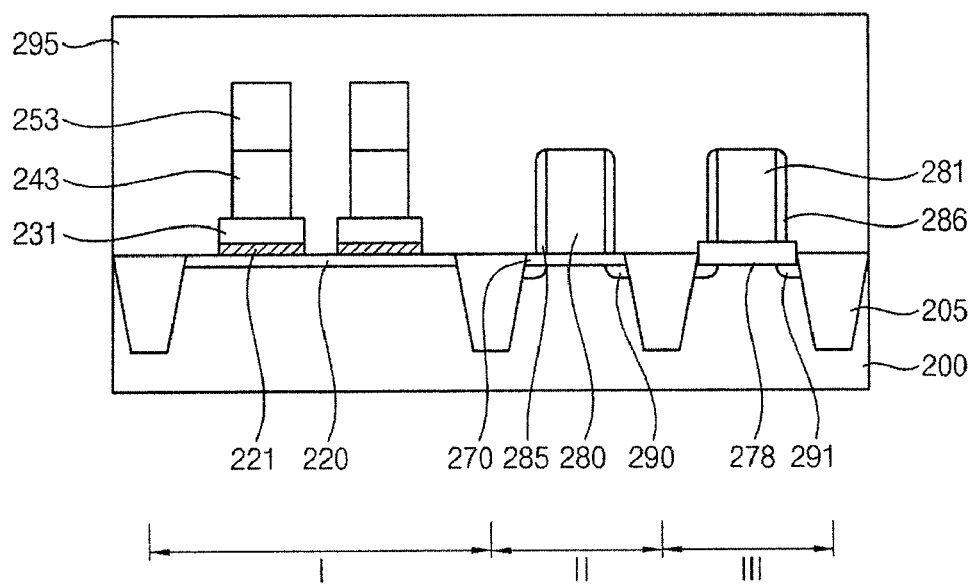

Referring to FIG. 15, a first insulation layer 295 is formed over the substrate 200 to cover all of the resultant structures formed on the substrate 200. Namely, the first insulation layer 295 covers the memory cell in the cell area I, the low voltage MOS transistor in the low voltage transistor area II, and the high voltage MOS transistor in the high voltage MOS transistor area III. The first insulation layer 295 may be formed using, for example, an oxide. For example, the first insulation layer 295 may include USG, SOG, TEOS, TOSZ, FOX, BPSG, HDP-CVD oxide, etc.

In example embodiments, the first insulation layer 295 may be formed while remaining the protection layer 265 in the cell area I. Alternatively, the first insulation layer 295 may be formed over the substrate 200 after removing the protection layer 265 in the cell area I. When the first insulation layer 295 is formed on the protection layer 265, planarization processes may be performed about the protection layer 265 and the first insulation layer 295. For example, a first planarization process may be executed on the protection layer 265 to reduce the height of the protection layer 265, and then a second planarization process may be performed about the first insulation layer 295 to ensure a level upper face of the first insulation layer 295.

In some example embodiments, the first insulation layer 295 may have a multi layer structure. In the formation of the first insulation layer 295, a first oxide layer may be formed over the substrate 200, and then a second oxide layer may be formed on the first oxide layer. Here, the first oxide layer may have a thickness of, for example, about 2,000 Å and the second oxide layer may have a thickness of, for example, about 6,000 Å. The second oxide layer may be provided on the first oxide layer after partially etching the first oxide layer. When the first insulation layer 295 has the multi layer structure, the first insulation layer 295 may not have a void or a seam generated therein.

Figure 16:
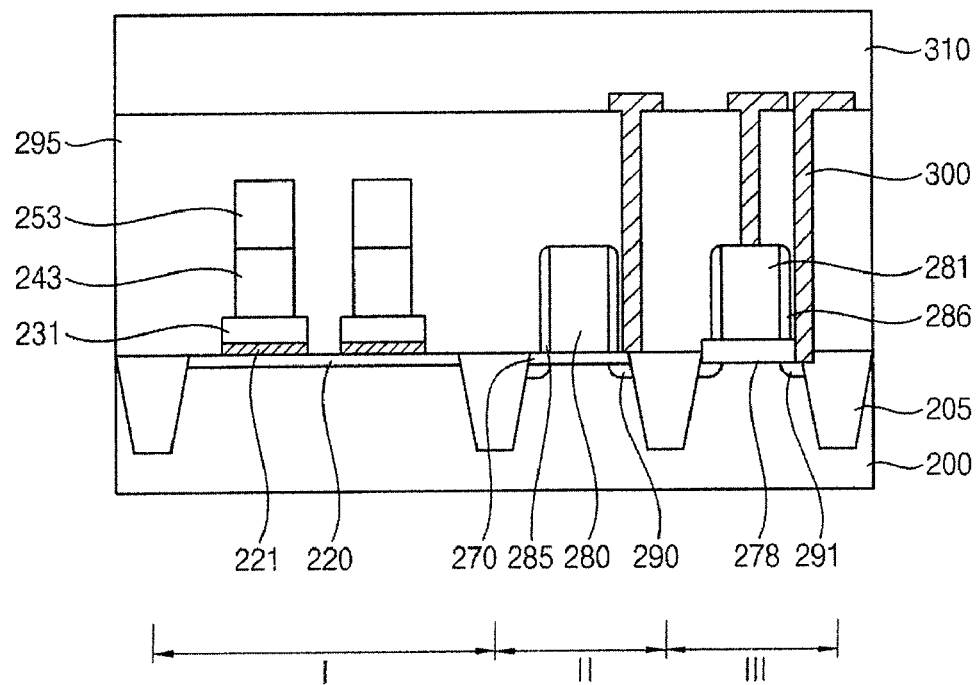

Referring to FIG. 16, contacts or plugs 300 are formed through the first insulation layer 295. The contact or the plugs 300 make contact with the first and the second impurity regions 290 and 291. The plugs 300 may be formed using, for example, aluminum, copper, tungsten, titanium, etc. These may be used alone or in a mixture thereof. The plugs 300 may be formed through the first insulation layer 295 after partially etching the first insulation layer 295 by a photolithography process.

A second insulation layer 310 is formed on the first insulation layer 295 to cover the plugs 300. The second insulation layer 310 may be formed using, for example, an organic material and/or an oxide.

According to example embodiments, the control gate 243 may have the width substantially smaller than the width of the blocking layer pattern 231 without forming any spacer on the sidewall of the control gate 243. That is, the offset is provided between the control gate 243 and the blocking layer pattern 231 to avoid the use of a spacer. Further, the charge trapping layer pattern 221 having enhanced retention property may be readily formed because of the process margin of the etching process for forming the charge trapping layer pattern 221. Thus, the flash memory device may have a high integration degree while improving electrical characteristics of the flash memory device such as, for example, a desired breakdown voltage, reduced leakage current, enhanced retention property, etc.

Figure 17:
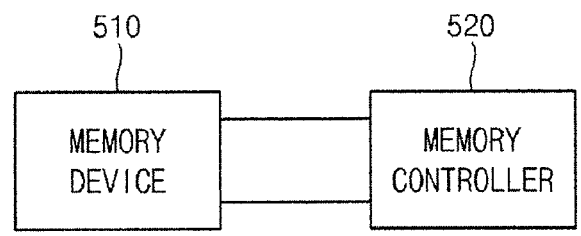
FIG. 17 is a block diagram illustrating one memory system in accordance with an example embodiment.

FIG. 17 is a block diagram illustrating a memory system in accordance with example embodiments.

Referring to FIG. 17, the memory system includes a memory controller 520 and a memory device 510 electrically connected to the memory controller 520. The memory device 510 may include the above-described charge trapping type flash memory device having the memory cell that includes the control gate having a width smaller than the width of the blocking layer pattern to avoid the use of a spacer. Alternatively, the memory device 510 may include other non-volatile semiconductor memory devices or volatile semiconductor memory devices such as, for example, DRAM devices, SRAM devices, etc. The memory controller 520 may provide an input signal into the memory device 510 to control the reading and the erasing operations of the memory device 510. For example, various signals such as command (CMD), address (ADD), input/output data (DQ) or a high-voltage (VPP) signal may be applied to the memory controller 520. The memory controller 520 may control the memory device 510 based on the applied various signals. The memory system may be employed in various electronic apparatuses such as, for example, a cellular phone, a portable multimedia player, a digital camera, etc.

Figure 18:
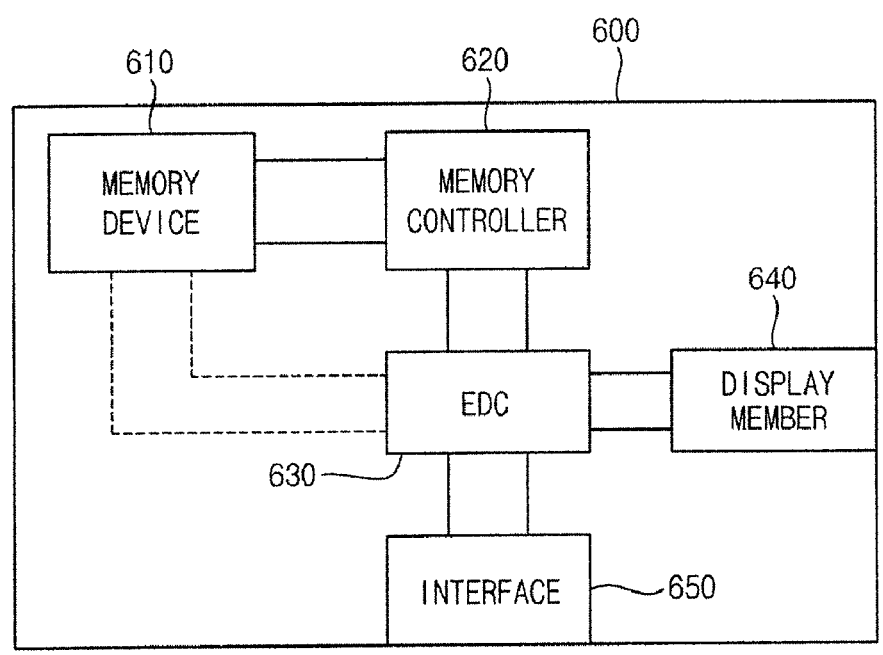
FIG. 18 is a block diagram illustrating another memory system in accordance with an example embodiment.

FIG. 18 is a block diagram illustrating another memory system in accordance with example embodiments.

Referring to FIG. 18, the memory system is used in a portable electronic apparatus 600. The portable electronic apparatus 600 may include, for example, an MP3 player, a portable video player, a portable multimedia player, a digital camera, etc. The memory system in the portable electronic apparatus 600 includes a memory device 610 and a memory controller 620. The memory device 610 may include the above-described charge trapping type flash memory device having the memory cell that includes the control gate having a width smaller than the width of the blocking layer pattern to avoid the use of a spacer. Further, the memory system includes an encoder/decoder (EDC) 630, a display member 640 and an interface 650. The memory device 610 may include a flash memory device having at least one buried shield structure.

The EDC 630 may input/output data such as audio data or video data into/from the memory device 610 through the memory controller 620. Alternatively, the data may be directly inputted from the EDC 630 into the memory device 610 or may be directly outputted from the memory device 610 into the EDC 630.

The EDC 630 may encode the data stored in the memory device 610. For example, the EDS 630 may carry out encoding of MP3 files to store the audio data into the memory device 610. Alternatively, the EDC 630 may encode MPEG files to store the video data into the memory device 610. Further, the EDS 630 may include a compound encoder for encoding different file types of various data. For example, the EDC 630 may include an MP3 encoder for the audio data and an MPEG encoder for the video data.

The EDC 630 may decode the data from the memory device 610. For example, the EDC 630 may perform decoding of the MP3 files based on the audio data stored in the memory device 610. Alternatively, the EDC 630 may execute decoding of MPEG files from the video data stored in the memory device 610. Therefore, the EDC 630 may include an MP3 decoder for the audio data and an MPEG decoder for the video data.

In example embodiments, the EDC 630 may include a decoder without an encoder. For example, encoded data may be inputted into the EDC 630, and then the encoded data may be directly stored into the memory device 610 or may be stored into the memory device 610 through the memory controller 620 when the EDC 630 has the decoder only.

In example embodiments, the EDC 630 may receive data for encoding or encoded data through the interface 650. The interface 650 may meet a predetermined reference such as, for example, a fire wire or a USB. For example, the interface 650 may include a fire wire interface or a USB interface. Further, the data stored in the memory device 610 may be outputted through the interface 650.

The display member 640 may display the data outputted from the memory device 610 or the decoded data from the EDC 630. For example, the display member 640 may include a speaker jack to output the audio data and/or a display screen to display the video data.

Figure 19:
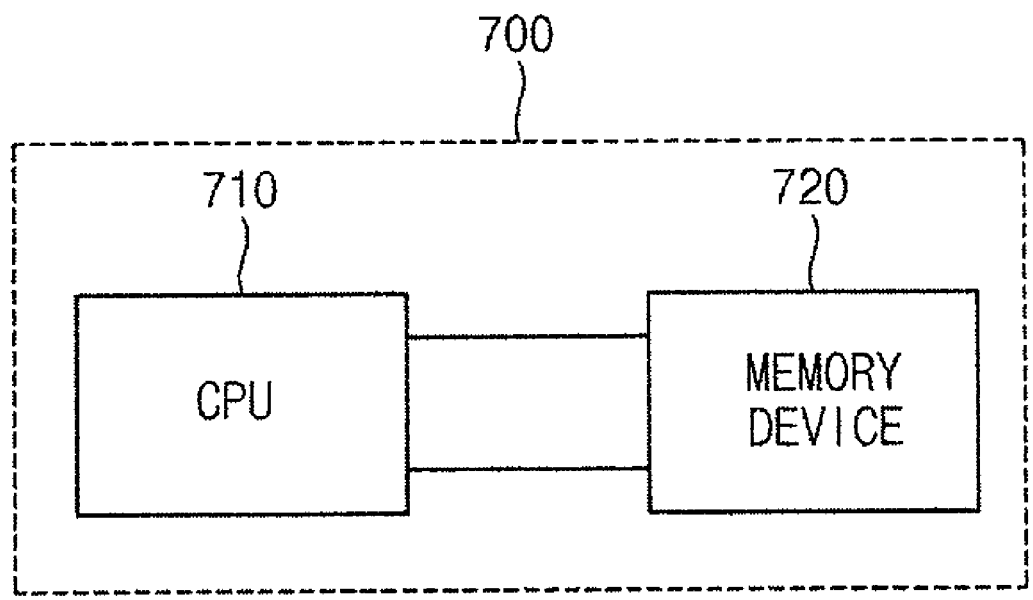
FIG. 19 is a block diagram illustrating another memory system in accordance with an example embodiment.

FIG. 19 is a block diagram illustrating still another memory system in accordance with example embodiments.

Referring to FIG. 19, the memory system includes a memory device 720 and a central processing unit (CPU) 710 in a computer system 700. The memory device 720 may include the above-described charge trapping type flash memory device having the memory cell that includes the control gate having a width smaller than the width the blocking layer pattern without a spacer. The memory device 720 is electrically connected to the CPU 710. For example, the computer system 700 may include a personal computer, a personal data assistant, etc. The memory device 720 may be directly connected to the CPU 710 or may be electrically connected to the CPU 710 through a BUS.

According to the inventive concept, a non-volatile semiconductor device may ensure enhanced electrical characteristics and improved integration degree because a memory cell of the non-volatile semiconductor device may include a control gate having a width substantially smaller than a width of a blocking layer pattern and a width of charge trapping layer pattern without forming a spacer on a sidewall of the control gate. Further, manufacturing processes for the non-volatile semiconductor device may be simplified as the spacer may not be provided on the sidewall of the control gate.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of manufacturing a non-volatile semiconductor device, comprising:
   forming a tunnel insulation layer on a substrate;
   forming a charge trapping layer on the tunnel insulation layer in a first area of the substrate;
   forming a blocking layer on the charge trapping layer;
   forming a preliminary control gate on the blocking layer;
   forming a control gate by primarily etching the preliminary control gate;
   forming a blocking layer pattern by partially etching the blocking layer;
   forming the control gate having a width smaller than a width of the blocking layer pattern by secondarily etching the control gate; and
   forming a charge trapping layer pattern by partially etching the charge trapping layer.

2. The method of claim 1, further comprising forming a hard mask on the preliminary control gate before forming the control gate.

3. The method of claim 2, wherein the forming of the hard mask comprises:
   forming a preliminary hard mask on the preliminary control gate;
   forming the hard mask by partially etching the preliminary hard mask; and
   forming the control gate using the hard mask as an etching mask.

4. The method of claim 1, further comprising thermally treating the blocking layer at a temperature of about 950° C. to about 1,200° C.

5. The method of claim 1, further comprising:
   forming a low voltage transistor in a second area of the substrate; and
   forming a high voltage transistor in a third area on the substrate.

6. A method of manufacturing a non-volatile semiconductor device, comprising:
   forming a tunnel insulation layer on a substrate;
   forming a charge trapping layer on the tunnel insulation layer in a first area of the substrate;
   forming a blocking layer on the charge trapping layer;
   forming a preliminary control gate on the blocking layer;
   forming a preliminary hard mask on the preliminary control gate;
   forming a blocking layer pattern on the charge trapping layer by partially etching the blocking layer;
   forming a hard mask and a control gate on the blocking layer pattern by partially etching the preliminary hard mask and the preliminary control gate, respectively, wherein the forming of the hard mask and the forming of the control gate are simultaneously performed, and wherein the blocking layer pattern has a width larger than a width of the control gate; and
   forming a charge trapping layer pattern on the tunnel insulation layer by partially etching the charge trapping layer.

7. The method of claim 6, wherein the preliminary hard mask and the preliminary control gate are partially etched along a direction in parallel to the substrate.

8. The method of claim 7, wherein the hard mask and the control gate are formed by one of a dry etching process and a wet etching process.

9. A method of manufacturing a non-volatile semiconductor device, comprising:
   sequentially forming a tunnel insulation layer, a charge trapping layer, a blocking layer, a control gate layer and a hard mask layer on a substrate having a cell area, a low voltage transistor area and a high voltage transistor area;

etching the hard mask layer to form a first mask in the cell area and a second mask in the low and the high voltage transistor areas;

etching the control gate layer to form a preliminary control gate in the cell area and a sacrificial conductive pattern in the low and the high voltage transistor areas;

etching the blocking layer to form a blocking layer pattern in the cell area and a sacrificial blocking layer pattern in the low and the high voltage transistor areas;

partially etching the first mask and the preliminary control gate to form a hard mask and a control gate in the cell area;

etching the charge trapping layer to form a charge trapping layer pattern in the cell area and a sacrificial charge trapping layer pattern in the low and the high voltage transistor areas;

removing the second mask, the sacrificial conductive pattern, the sacrificial blocking layer pattern and the sacrificial charge trapping layer pattern in the low and the high voltage transistor areas;

forming a low voltage MOS transistor in the low voltage transistor area; and forming a high voltage MOS transistor in the high voltage transistor area.

10. The method of claim 9, wherein the partially etching of the first mask and the preliminary control gate comprises horizontally etching the first mask and the preliminary control gate.

11. The method of claim 9, wherein the control gate has a width smaller than a width of the blocking layer pattern such that a spacer is not formed on a sidewall of the control gate.

12. The method of claim 9, further comprising forming a protection layer in the cell area to cover the hard mask, the control gate, the blocking layer pattern and the charge trapping layer pattern before removing the second mask, the sacrificial conductive pattern, the sacrificial blocking layer pattern and the sacrificial charge trapping layer pattern.

* * * * *